(12) United States Patent
Su et al.

(10) Patent No.: US 11,018,057 B2
(45) Date of Patent: May 25, 2021

(54) SEMICONDUCTOR DEVICES

(71) Applicant: Taiwan Semiconductor Manufacturing Co., Ltd., Hsinchu (TW)

(72) Inventors: Fu-Hsiang Su, Hsinchu (TW); Jyh-Huei Chen, Hsinchu (TW); Kuo-Chiang Tsai, Hsinchu (TW); Ke-Jing Yu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/876,127

(22) Filed: May 18, 2020

(65) Prior Publication Data

US 2020/0279774 A1 Sep. 3, 2020

Related U.S. Application Data

(63) Continuation of application No. 16/175,802, filed on Oct. 30, 2018, now Pat. No. 10,658,237.

(60) Provisional application No. 62/712,214, filed on Jul. 31, 2018.

(51) Int. Cl.
*H01L 21/768* (2006.01)
*H01L 27/092* (2006.01)
*H01L 23/535* (2006.01)
*H01L 21/033* (2006.01)
*H01L 21/8238* (2006.01)

(52) U.S. Cl.
CPC .... *H01L 21/76897* (2013.01); *H01L 21/0332* (2013.01); *H01L 21/0335* (2013.01); *H01L 21/823821* (2013.01); *H01L 21/823871* (2013.01); *H01L 23/535* (2013.01); *H01L 27/0924* (2013.01)

(58) Field of Classification Search
None
See application file for complete search history.

(56) References Cited

U.S. PATENT DOCUMENTS

| | | | |
|---|---|---|---|
| 9,564,363 B1 * | 2/2017 | Wang | H01L 21/76895 |
| 10,658,237 B2 * | 5/2020 | Su | H01L 27/0924 |
| 2019/0131430 A1 * | 5/2019 | Xie | H01L 29/785 |

\* cited by examiner

*Primary Examiner* — Hsien Ming Lee
(74) *Attorney, Agent, or Firm* — JCIPRNET

(57) ABSTRACT

A semiconductor device includes a substrate, a first gate structure and a second gate structure over the substrate, a first hard mask on a top surface of the first gate structure, a second hard mask on the second gate structure and a third hard mask disposed between the first gate structure and the second gate structure and disposed between the first hard mask and the second hard mask. A bottom surface of the third hard mask is substantially flush with a bottom surface of the first gate structure.

20 Claims, 15 Drawing Sheets

SEMICONDUCTOR DEVICES

CROSS-REFERENCE TO RELATED APPLICATION

This application is a continuation application of and claims the priority benefit of a prior application Ser. No. 16/175,802, filed on Oct. 30, 2018, and claims the priority benefit of U.S. provisional application Ser. No. 62/712,214, filed on Jul. 31, 2018. The entirety of each of the above-mentioned patent applications is hereby incorporated by reference herein and made a part of this specification.

BACKGROUND

The semiconductor integrated circuit (IC) industry has experienced exponential growth. Technological advances in IC design and materials have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, scaling down has also increased the risk of bridging or electrical shorting problems, which would degrade semiconductor device performance or even cause device failures. Although existing semiconductor fabrication methods have been generally adequate for their intended purposes, they have not been entirely satisfactory in all respects.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
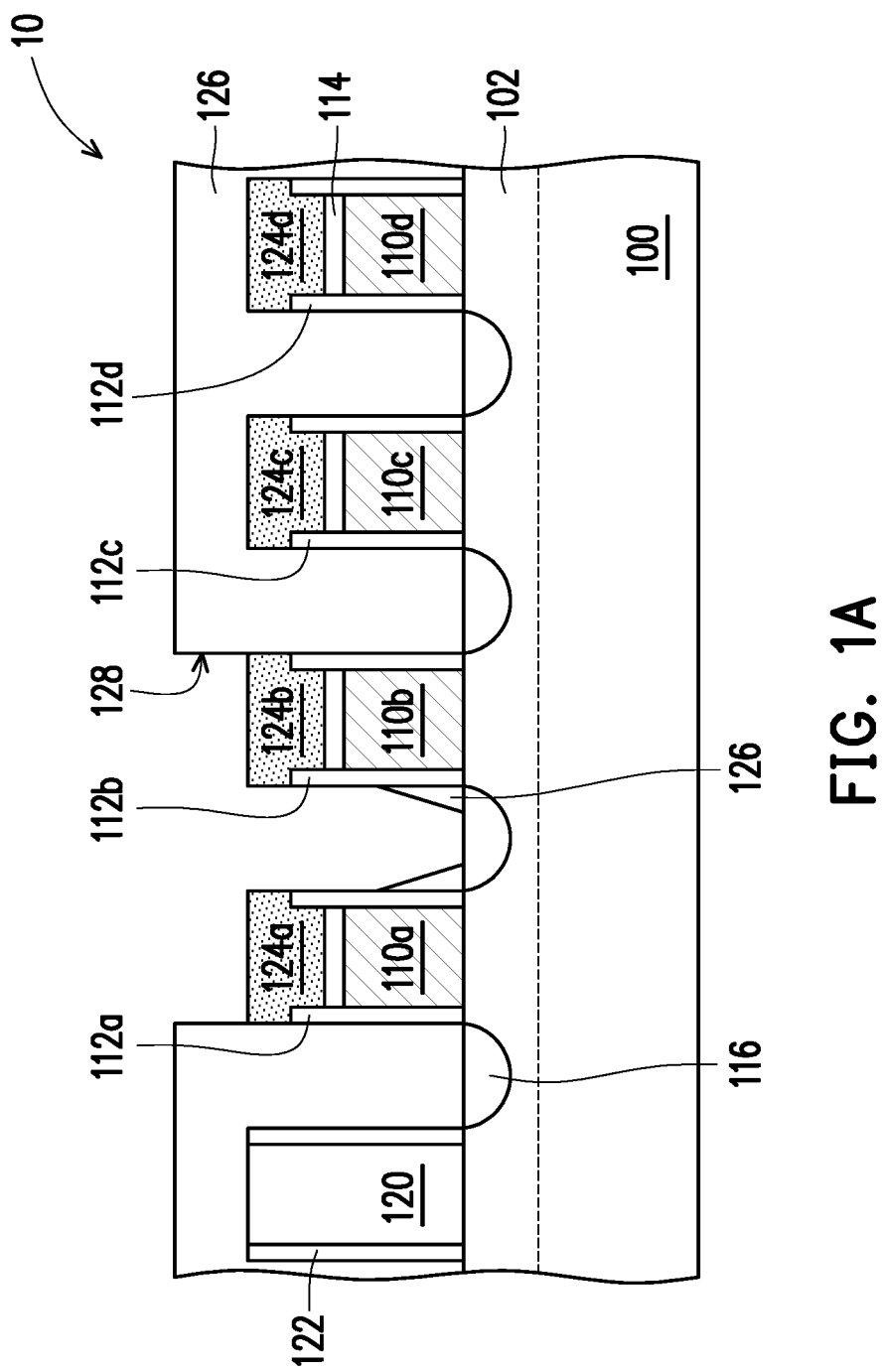
FIGS. 1A to 1J are cross-sectional views at various stages of forming a semiconductor device in accordance with some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
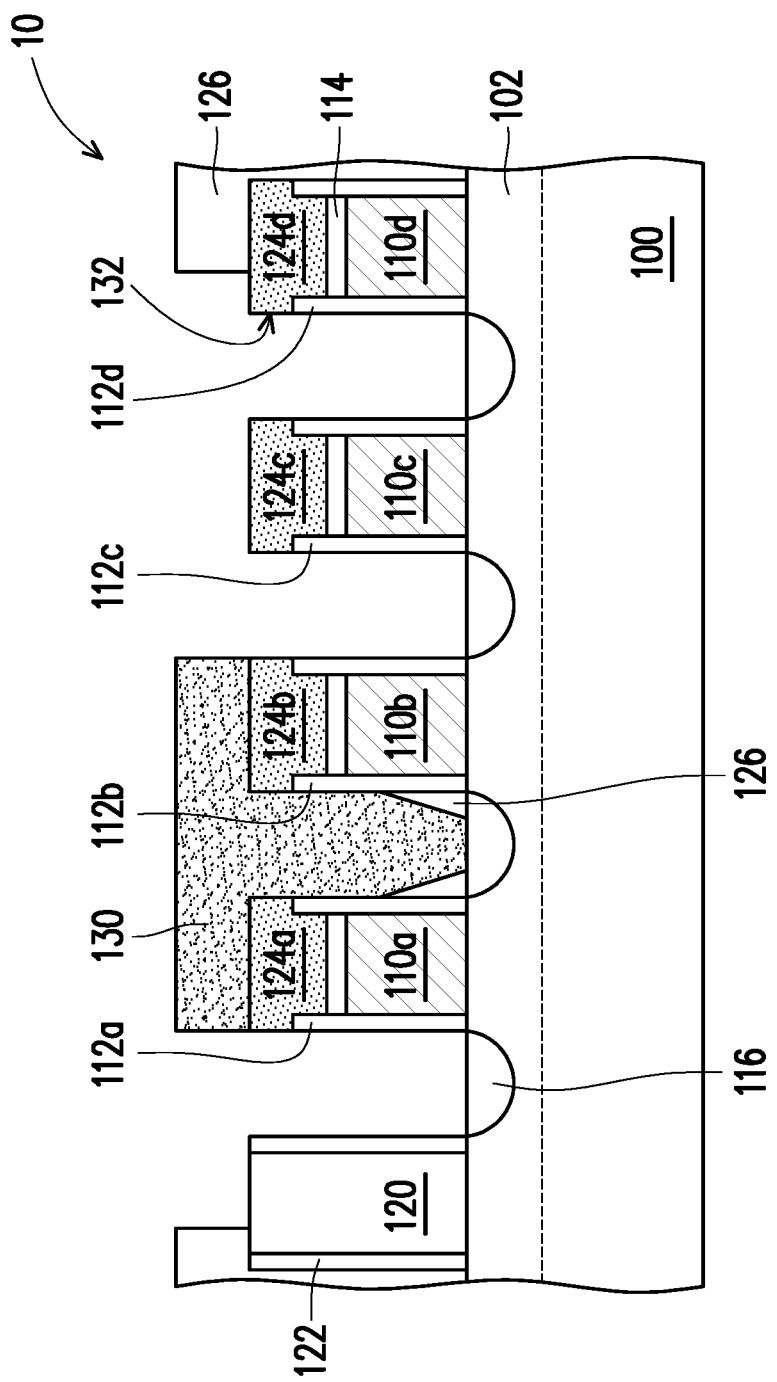

FIGS. 1A to 1J are cross-sectional views at various stages of forming a semiconductor device in accordance with some embodiments of the present disclosure. FIGS. 2A to 2H are cross-sectional views at various stages of forming a semiconductor device in accordance with some embodiments of the present disclosure. Referring to FIGS. 1A and 2A, a semiconductor device 10 is provided. In some embodiments, the semiconductor device 10 is a field effect transistor such as a fin field effect transistor (FinFET). The FinFET refers to any fin-based, multi-gate transistor. In alternative some embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC).

In addition, the semiconductor device 10 of FIGS. 1A to 1J and 2A to 2H may be further processed using CMOS technology processing. Accordingly, it is understood that additional processes may be provided before, during, and after the method of FIGS. 1A to 1J and 2A to 2H, and that some other processes may only be briefly described herein. Also, FIGS. 1A to 1J and 2A to 2H are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

The semiconductor device 10 includes a substrate 100. The substrate 100 includes silicon in some embodiments. Alternatively or additionally, the substrate 100 may include other elementary semiconductor such as germanium. The substrate 100 may also include a compound semiconductor such as silicon carbide, gallium arsenic, indium arsenide, and indium phosphide. The substrate 100 may also include an alloy semiconductor such as silicon germanium, silicon germanium carbide, gallium arsenic phosphide, and gallium indium phosphide. In one embodiment, the substrate 100 includes an epitaxial layer. For example, the substrate 100 may have an epitaxial layer overlying a bulk semiconductor. Furthermore, the substrate 100 may include a semiconductor-on-insulator (SOI) structure. For example, the substrate 100 may include a buried oxide (BOX) layer formed by a process such as separation by implanted oxygen (SIMOX) or other suitable technique, such as wafer bonding and grinding.

The substrate 100 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). As examples, FIG. 1A illustrates a plurality of source/drain regions 116 formed in the substrate 100.

In some embodiments, a plurality of fins 102 are formed on and/or in the substrate 100. In some embodiments, portions of the substrate 100 are removed to define the fins 102 protruding from the substrate 100. In some embodiments, the substrate 100 and the fins 102 are integrally formed, that is, there is no boundary between the substrate 100 and the fins 102. However, other techniques for fabricating the fins 102 are possible. In some embodiments, the substrate 100 and the fins 102 are made of a same material. In some embodiments, the fins 102 are respectively extended along a first direction such as the x direction, and the fins 102 are arranged in a second direction perpendicular to the first direction such as the y direction, for example. In some embodiments, as shown in FIG. 2A, a dummy fin 104 is further formed between the fins 102, and the dummy fin 104 may be substantially parallel to the fins 102, for example.

In some embodiments, an isolation structure 106 is formed between the fins 102, such as a local oxidation of silicon (LOCOS) or a shallow trench isolation (STI) structure. The isolation structure 106 is configured to isolate the adjacent fins 102. The isolation structure 106 may be formed by filling a trench between the fins 102 with a dielectric material. In some embodiments, the dielectric material may include silicon oxide, silicon nitride, silicon oxynitride, fluoride-doped silicate glass (FSG), a spin-on dielectric material, a low-k dielectric material, any other suitable dielectric material or a combination thereof. The dielectric material may be formed by high-density-plasma chemical vapor deposition (HDP-CVD), sub-atmospheric CVD (SACVD) or by spin-on. In some embodiments, the isolation structure 106 may have a multi-layer structure such as a thermal oxide liner layer filled with silicon nitride or silicon oxide.

The semiconductor device 10 includes a plurality of gate structures 110a-110d and a plurality of "gate helmets" 124a-124d located over the gate structures 110a-110d respectively. The gate structures 110a-110d each are disposed on and cross over portions of the fins 102. The gate structures 110a-110d each include a gate dielectric layer and a gate electrode, for example. In some embodiments, the gate structures 110a-110d each further include a cap layer 114 thereon. In some embodiments, a material of the gate dielectric layer may be silicon oxide, silicon nitrides, silicon oxynitride or any other suitable dielectric material. In some embodiments, the gate dielectric layer may include a high-k dielectric material having a dielectric constant that is greater than a dielectric constant of $SiO_2$, which is approximately 4. In some embodiments, the high-k gate dielectric material includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO or any other suitable high-k dielectric material. The metal gate electrode is formed over the gate dielectric. In some embodiments, a material of the metal gate electrode includes TiAl, TiAlN, TaCN, TiN, WN, W, combinations thereof or any other suitable conductive material. The cap layer 114 is formed over the gate electrode. In some embodiments, a material of the cap layer 114 includes aluminum (Al), tungsten (W), copper (Cu), combinations thereof or any other suitable conductive material. In some embodiments, a height of the gate structures 110a-110d and the conductive cap layers 114 thereon ranges from 14 to 22 nm, for example.

A pair of gate spacers 112a-112d is respectively formed on the sidewalls of the gate structures 110a-110d. In some embodiments, the top surfaces of the gate spacers 112a-112d are higher than the top surfaces of the gate structures 110a-110d. In some embodiments, the top surfaces of the gate spacers 112a-112d may be higher than the top surfaces of the cap layers 114. In some embodiments, the gate spacers 112a-112d may be single-layer structure or multi-layer structure, for example. In some embodiments, a material of the gate spacers 112a-112d may be $SiO_2$, SiN, SiON, SiCN or any other suitable material.

In some embodiments, the semiconductor device 10 further includes a hard mask 120 on the substrate 100 beside the gate structure 110a. In some embodiments, the hard mask 120 may be used in the patterning process of metal gates (MG) of the adjacent two transistors, and thus the hard mask 120 may be also referred as a "cut metal gates (MG) hard mask". In some embodiments, a spacer 122 is formed on a sidewall of the hard mask 120, and the top surface of the spacer 122 is higher than the top surfaces of the gate spacers 112a-112d aside the gate structures 110a-110d. In some embodiments, a material of the hard mask 120 may be SiN, SiON, SiCN or any other suitable material.

In some embodiments, the top surfaces of the gate spacers 112a-112d are in direct contact with portions of the gate helmets 124a-124d. Due to the presence of the gate spacers 112a-112d, the gate helmets 124a-124d each have a T-shaped cross-sectional profile. In some embodiments, opposite sidewalls of the gate helmets 124a-124d are respectively overlapped and aligned with outer sidewalls of the gate spacers 112a-112d, for example. The gate helmets 124a-124d contain a dielectric material. In some embodiments, the dielectric material may include high-k dielectric having a dielectric constant greater than a dielectric constant of $SiO_2$, which is approximately 4. The high-k dielectric material may have a dielectric constant greater than about 5, greater than about 8 or even greater than about 10. The high-k dielectric material includes SiON, metal oxides such as oxides of Ta, Ti, Li, Be, Mg, Ca, Sr, Sc, Y, Zr, Hf, Al, La, Ce, Pr, Nd, Sm, Eu, Gd, Tb, Dy, Ho, Er, Tm, Yb and Lu and any other suitable materials. In an embodiment, the gate helmets 124a-124d include $ZrO_2$, for example.

In some embodiments, before forming the gate helmets 124a-124d on the gate structures 110a-110d and the gate spacers 112a-112b, the gate structures 110a-110d and the gate spacers 112a-112b may have a height substantially the same as the hard mask 120 and the spacer 122. However, in order to form the gate helmets 124a-124d, the top portions of the gate structures 110a-110d are removed by an etching process such as an etch back process, and the top surfaces of the gate structures 110a-110d are lowered than the top surfaces of the gate spacers 112a-112d. Then, the cap layers 114 may be then formed on the gate structures 110a-110d respectively. After that, the gate helmets 124a-124d are formed on the conductive cap layers 114 over the gate structures 110a-110d and the gate spacers 112a-112d aside the gate structures 110a-110d.

In some embodiments, source-drain regions 116 are disposed over the fins 102 aside the gate structures 110a-110d respectively. The source-drain regions 116 may be formed before forming the gate helmets 124a-124d. In some embodiments, the source-drain regions 116 have the top surfaces higher than the top surfaces of the fins 102. In some embodiments, the source-drain regions 116 may be formed by an epitaxy process, a deposition process or any other suitable process. In addition, although the source-drain regions 116 is shaped as a diamond in FIG. 2A, the disclosure is not limited thereto. In some alternative embodiments, the source-drain regions 116 may be shaped as any suitable shapes. In some embodiments, a contact etch stop layer (CESL) 118 is formed over the source-drain regions 116. In some embodiments, the CESL 118 may include SiN, SiON, SiCN, or the like. In some alternative embodiments, a buffer layer (not shown) is further formed between the CESL 118 and the source-drain regions 116, for example.

In some embodiments, a dielectric layer 126 is disposed over the substrate 100. In some embodiments, the dielectric layer 126 covers the hard mask 120 and the gate structures 110c, 110d and filled into the openings formed between the hard mask 120 and the gate structure 110a and between the gate structures 110b-110d. In some embodiments, the dielectric layer 126 has an opening 128, and the opening 128 exposes the source-drain region 116 between the gate structures 110a, 110b and further exposes the gate helmets 124a, 124b over the gate structures 110a, 110b. In some embodiments, as shown in FIG. 1A, portions of the dielectric layer 126 are disposed between the opening 128 and the gate spacers 112a, 112b. In some embodiments, the opening 128 has a T-shaped cross-sectional profile. In some embodiments, as shown in FIG. 1B, the dielectric layer 126 covers a plurality of source-drain regions 116 on a plurality of fins 102, the dummy fin 104 and the CESL 118. The dielectric layer 126 may be a single-layer structure or multi-layer structure. A material of the dielectric layer 126 may be $SiO_2$, SiN, SiON, SiCN, or any other suitable material. In some embodiments, the opening 128 may be formed by partially removing the dielectric layer 126 through an etching process such as a dry etching process or a wet dry etching process.

Figure 2A:
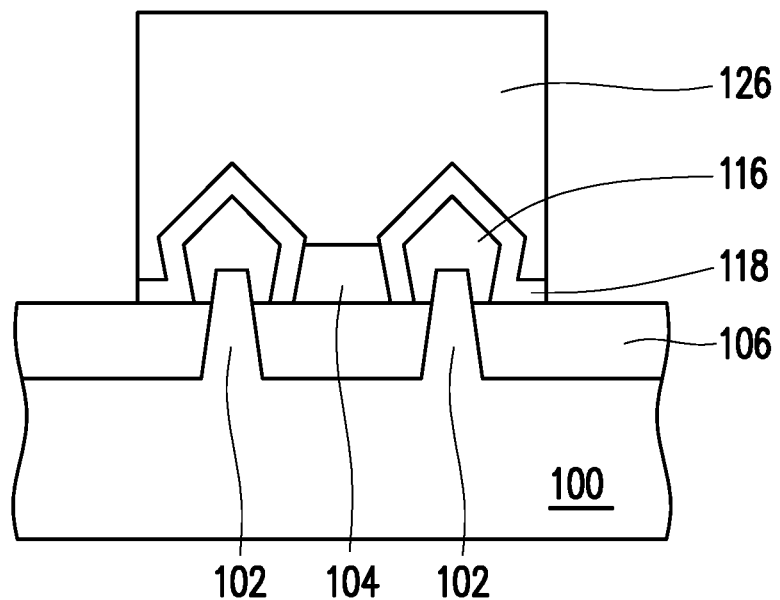
FIGS. 2A to 2H are cross-sectional views at various stages of forming a semiconductor device in accordance with some embodiments of the present disclosure.
Figure 2B:
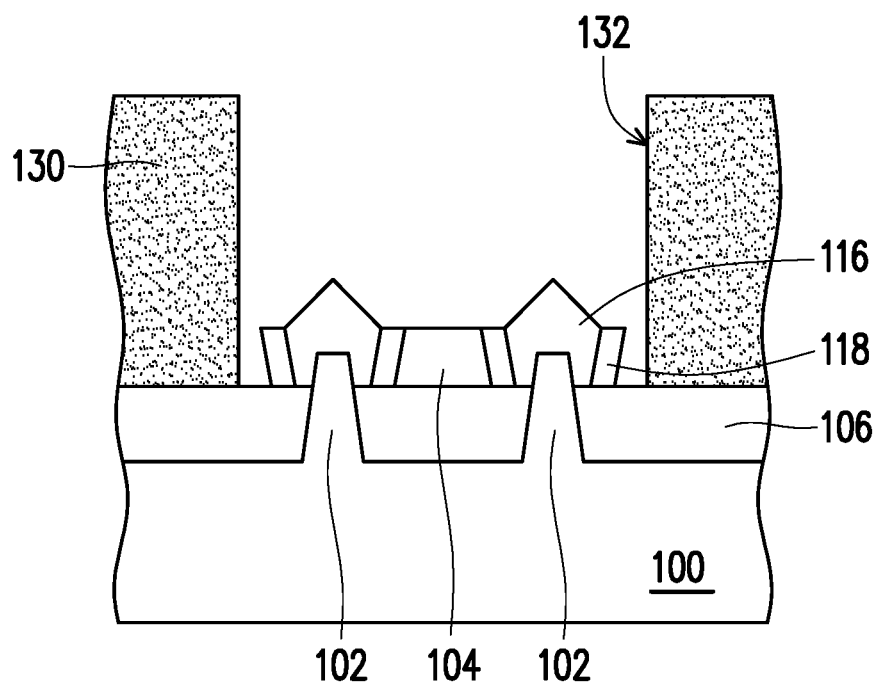

Referring to FIGS. 1B and 2B, a hard mask 130 is formed in the opening 128. In some embodiments, the hard mask 130 is disposed between the gate structures 110a, 110b and extends onto the gate helmets 124a, 124b over the gate structures 110a, 110b. In some embodiments, the hard mask 130 is formed as a plug and has a T-shaped cross-sectional profile, for example. In some embodiments, the sidewalls of the hard mask 130 is substantially aligned with the outer sidewalls of the gate spacers 112a, 112b and the outer sidewalls of the gate helmets 124a, 124b, for example. In some embodiments, as shown in FIG. 2B, the hard mask 130 is formed aside the adjacent source-drain regions 116. In some embodiments, the hard mask 120 may be used in the patterning process of metal drains (MD) of the adjacent two transistors, and thus the hard mask 130 may be also referred as a "cut metal drains (CMD) hard mask" or a "CMD plug". A material of the hard mask 130 is different from the material of the dielectric layer 126. In some embodiments, the hard mask 130 may include high-k dielectric material having a dielectric constant greater than a dielectric constant of $SiO_2$, which is approximately 4. The high-k dielectric material may have a dielectric constant greater than about 5, greater than about 8 or even greater than about 10. The high-k dielectric material includes SiON, metal oxides such as oxides of Ta, Ti, Li, Be, Mg, Ca, Sr, Sc, Y, Zr, Hf, Al, La, Ce, Pr, Nd, Sm, Eu, Gd, Tb, Dy, Ho, Er, Tm, Yb and Lu or any other suitable materials. In an embodiment, the hard mask 130 include $ZrO_2$, for example. The hard mask 130 is single-layer structure or multi-layer structure. In some embodiments, the hard mask 130 is formed by forming a dielectric material over the dielectric layer 126 to fill into the opening 128 by a deposition process or any other suitable process, and then removing portions of the dielectric material outside the opening 128 by a planarization process such as a chemical mechanical planarization process, for example.

As shown in FIGS. 1B and 2B, portions of the dielectric layer 126 are removed to form openings 132. In some embodiments, the openings 132 expose the source-drain regions 116. In some embodiments, the dielectric layer 126 may be partially removed by an etching process such as a dry etching process or a wet dry etching process to form the openings 132, for example. In some embodiments, as shown in FIG. 2B, portions of the CESL 118 are removed to expose the top surfaces of the source-drain regions 116. After partially removed, the CESL 118 is disposed on bottom sidewalls of the source-drain regions 116 respectively. In some embodiments, gaps are formed between the CESL 118 on the source-drain region 116 and the hard mask 130, for example.

Figure 1C:
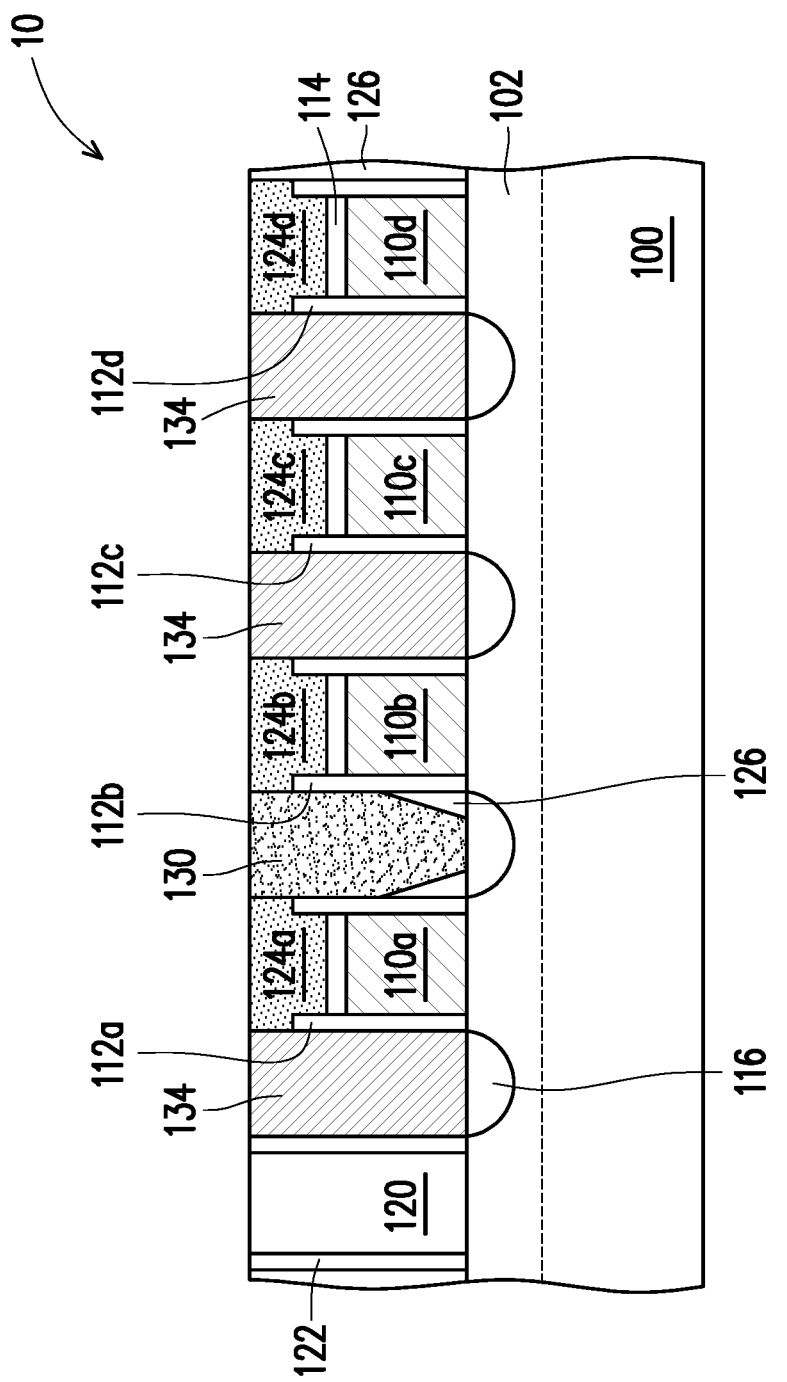
Figure 2C:
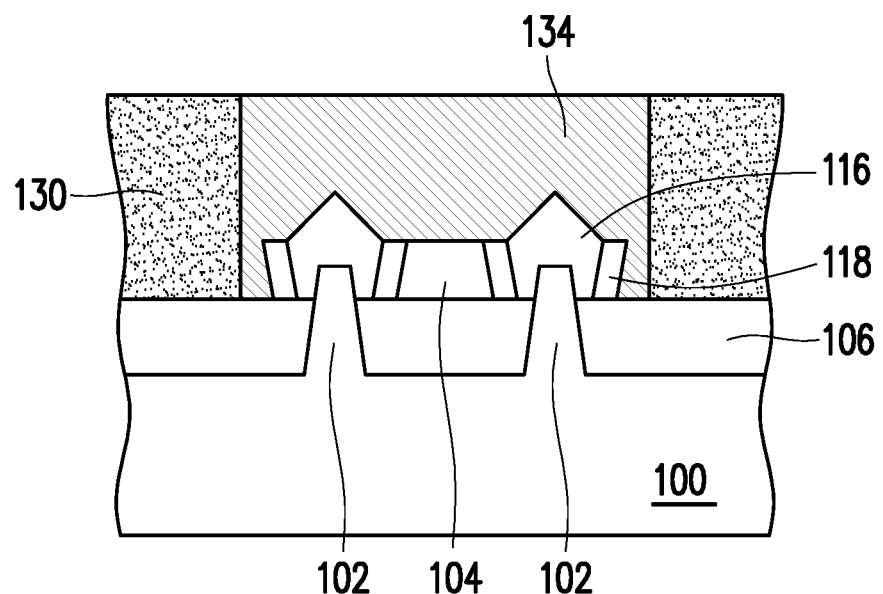

Referring to FIGS. 1C and 2C, a plurality of conductive contacts 134 is formed to electrically connect to the source-drain regions 116 respectively. In some embodiments, the conductive contacts 134 are formed in the openings 132 and the conductive contacts 134 are insulated from the gate structures 110a-110d by the gate spacers 112a-112d therebetween. The conductive contacts 134 may be in direct contact with the source-drain region 116, for example. In some embodiments, a material of the conductive contacts 134 may be metal such as cobalt (Co), tungsten (W), copper (Cu), titanium (Ti), tantalum (Ta), aluminum (Al), zirconium (Zr), hafnium (Hf) or the like. In some embodiments, a height of the conductive contacts 134 may range from 14 to 22 nm, for example. In some embodiments, the conductive contacts 134 are also referred to as "MD (metal drain)" contacts. In some embodiments, as shown in FIG. 2C, the conductive contacts 134 is formed in the gaps between the CESL 118 on the sidewalls of the source-drain regions 116 and the hard mask 130, for example.

In some embodiments, the top surfaces of the conductive contacts 134, the hard mask 130 and the gate helmets 124a-124d are coplanar and higher than the top surfaces of the gate spacers 112a-112d, for example. In some embodiments, the formation of the conductive contacts 134 and removal of portions of the hard mask 130 may be performed simultaneously or separately. For example, a conductive material is formed over the substrate 100 to fill the openings 132 and covers the dielectric layer 126, the hard mask 130 and the gate helmets 124c, 124d by a sputtering process, a deposition process such as PVD, CVD or atomic layer deposition (ALD) or any other suitable process. Then, by using the top surfaces of the gate helmets 124a-124d as a stop layer, portions of the conductive material and the hard mask 130 are removed to form the conductive contacts 134, and portions of the hard mask 130 are removed to expose the gate helmets 124a, 124b. Accordingly, the top surfaces of the conductive contacts 134 are flush with the top surfaces of the hard mask 130 and the gate helmets 124a-124d.

Figure 1D:
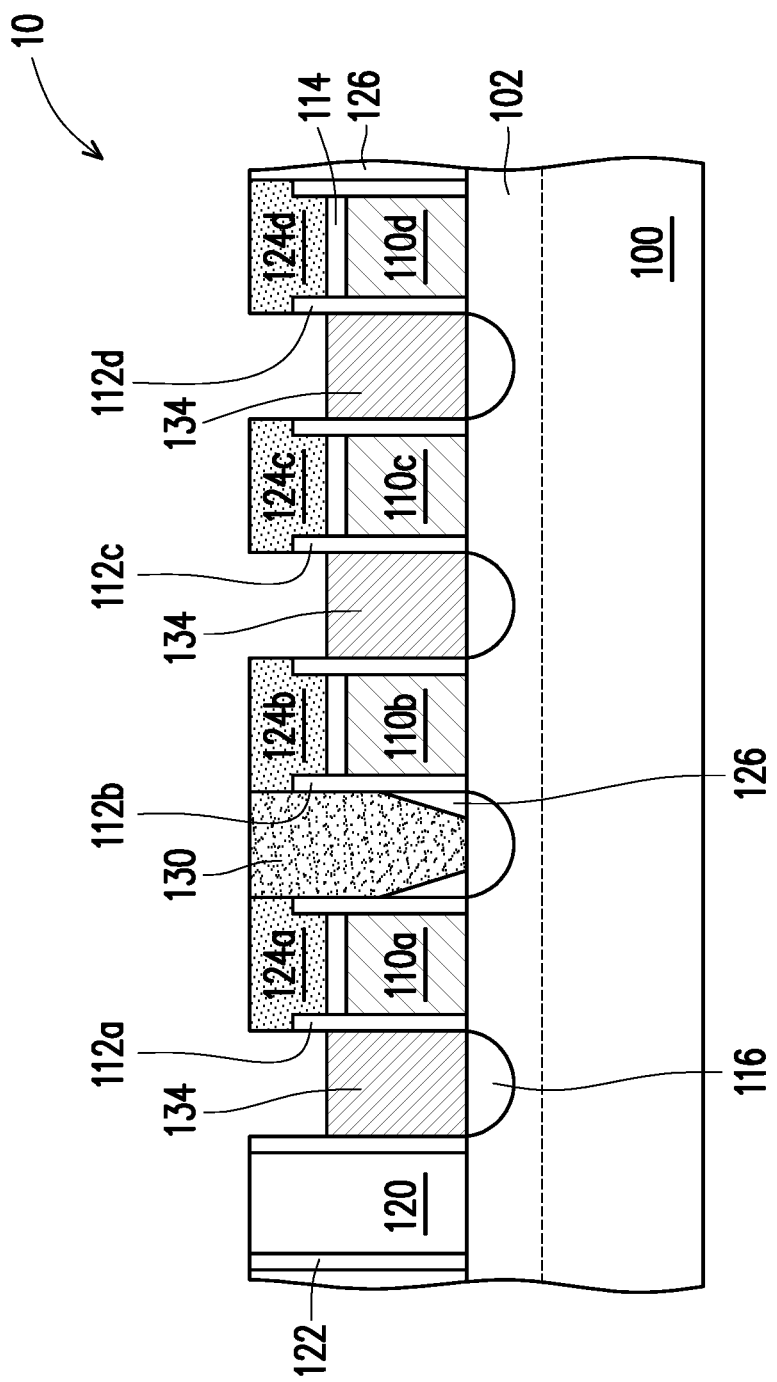
Figure 2D:
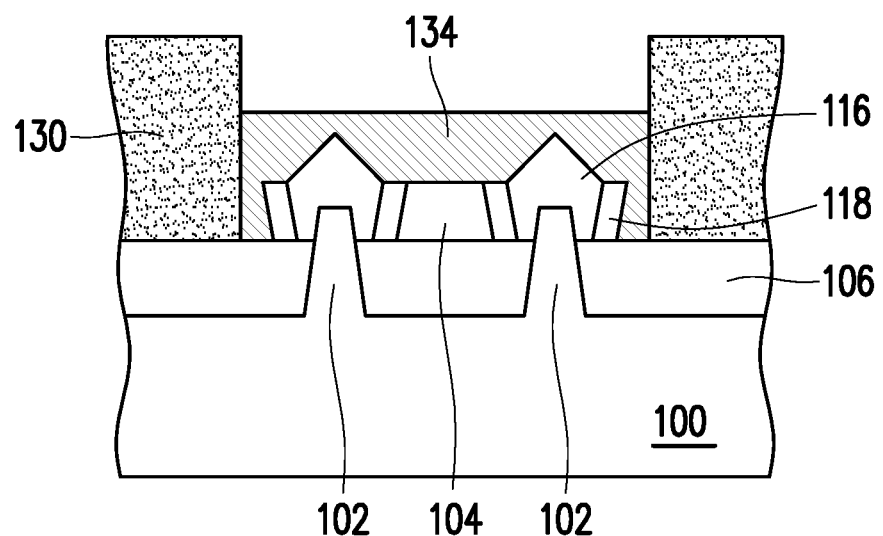

Referring to FIGS. 1D and 2D, the conductive contacts 134 are partially removed, and thus the top surfaces of the conductive contacts 134 are lower than the top surfaces of the gate spacers 112a-112d. In some embodiments, the conductive contacts 134 may be partially removed by an etch back process, for example. In some embodiments, after partially removing the conductive contacts 134, portions of the gate spacers 112a-112d and the spacer 122 are exposed.

Figure 1E:
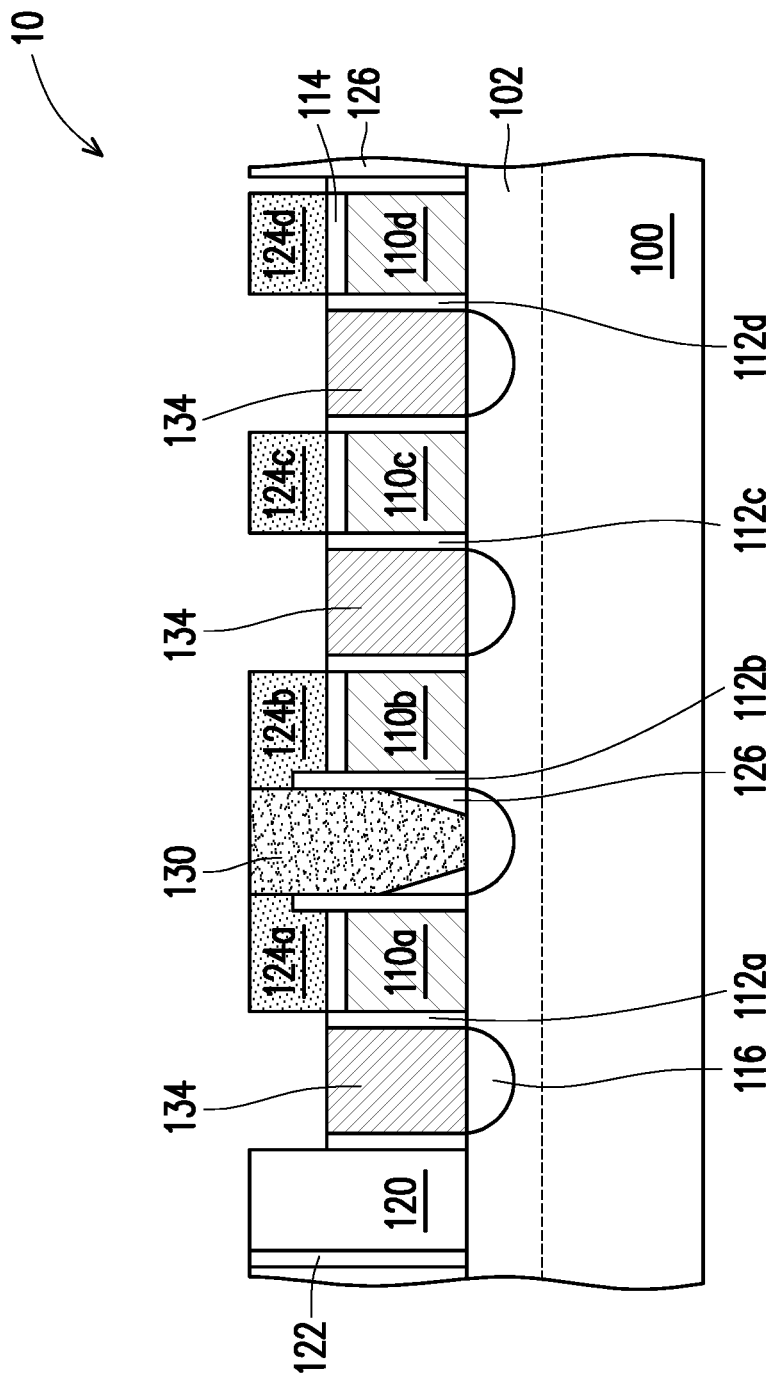

Referring to FIG. 1E, the exposed portions of the gate spacers 112a-112d and the spacer 122 are removed. In some embodiments, portions of the gate helmets 124a-124d on the exposed portions of the gate spacers 112a-112d are also removed. After partially removed, the gate helmets 124a-124d shrinks inwardly, and exposed sidewalls of the gate helmets 124a-124d may be aligned with outer sidewalls of the gate spacers 112a-112d, for example. In some embodiments, the top surfaces of the conductive contacts 134 are substantially flush with the spacer surrounding them and derived from the gate spacers 112a-112d and the spacer 122. In other words, a height of the said spacers may be substantially the same as a height of the conductive contacts 134. It is noted that since the gate spacers 112a, 112b on the sidewalls of the hard mask 130 is not exposed, the unexposed portions of the gate spacers 112a, 112b are intact while the exposed gate spacers 112a-112d are partially removed.

Figure 1F:
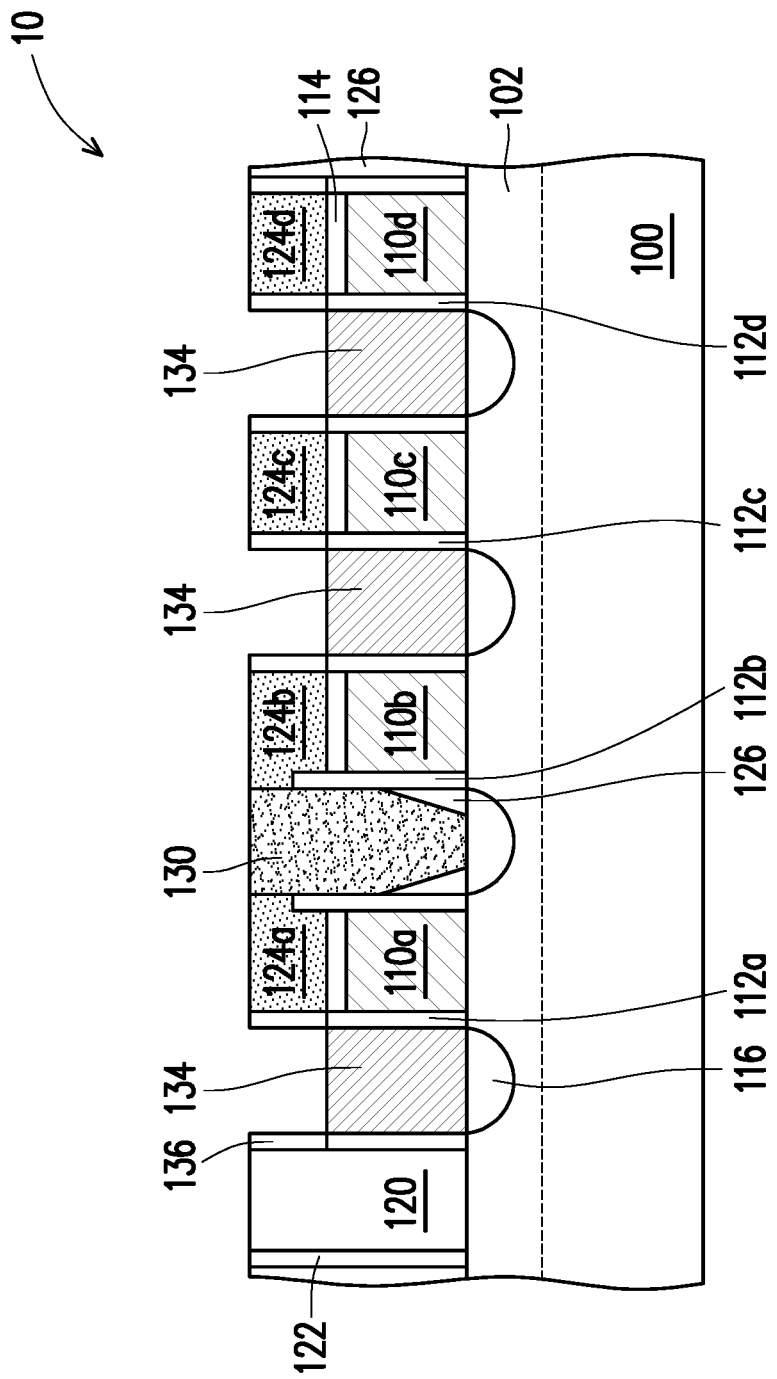
Figure 2E:
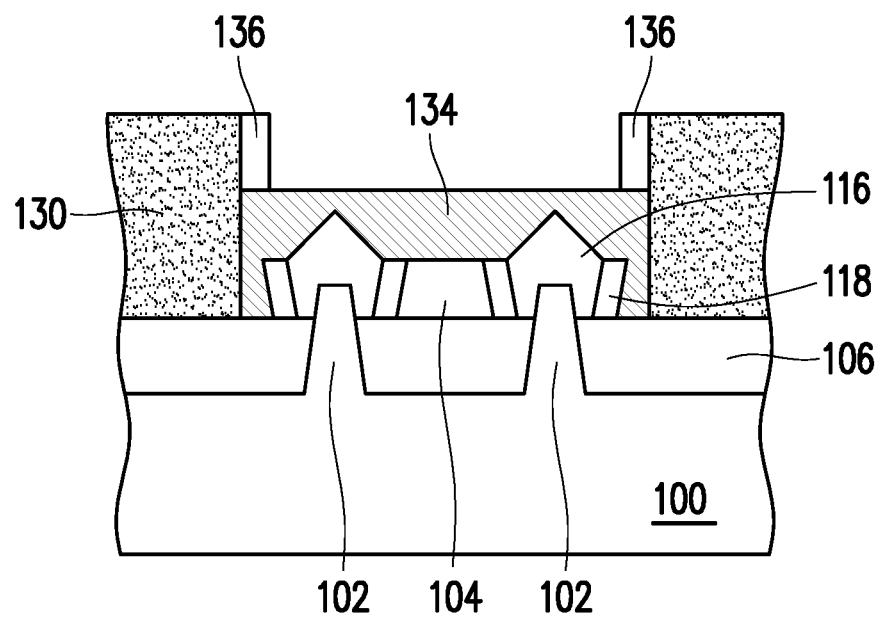

Referring to FIGS. 1F and 2E, spacers 136 are formed on the exposed spacer 122 and the exposed gate spacers 112a-112d respectively, and the top surfaces of the spacers 136 are higher than the gate spacers 112a, 112b on the sidewalls of the hard mask 130. In some embodiments, the spacers 136 are disposed on exposed sidewalls of the gate helmets 124a-124d and the hard mask 120. In some embodiments, the spacers 136 are aligned with the spacer 122 and the gate spacers 112a-112d therebeneath, and a thickness of the spacers 136 may be substantially the same as a thickness of the spacer 122 and the gate spacers 112a-112d therebeneath. In some embodiments, a material of the spacers 136 may be different from or the same as a material of the gate spacers 112a-112d and the spacer 122, for example. In some embodiments, interfaces are substantially formed between the spacers 136 and the gate spacers 112a-112d therebeneath. In some embodiments, the material of the spacers 136 may be $SiO_2$, SiN, SiON, SiCN or any other suitable material.

Figure 1G:
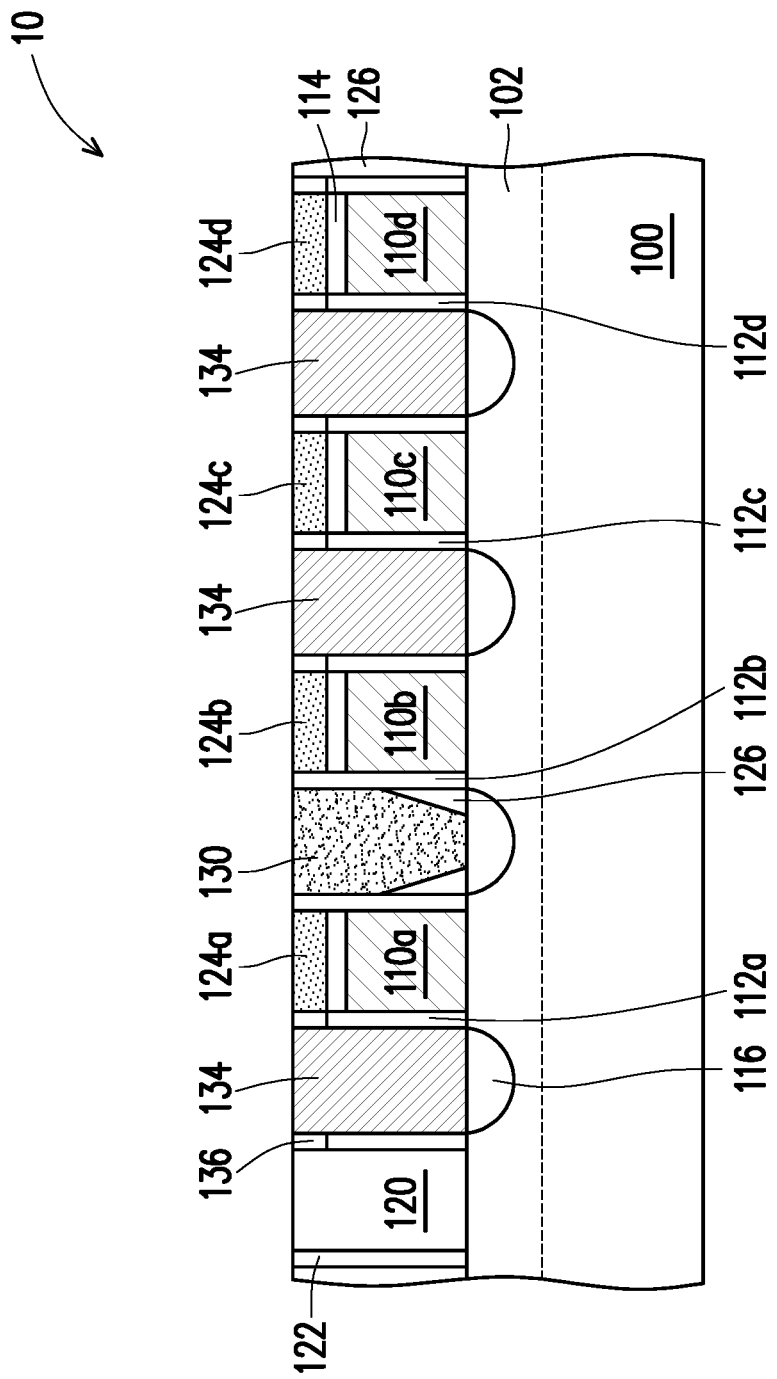
Figure 2F:
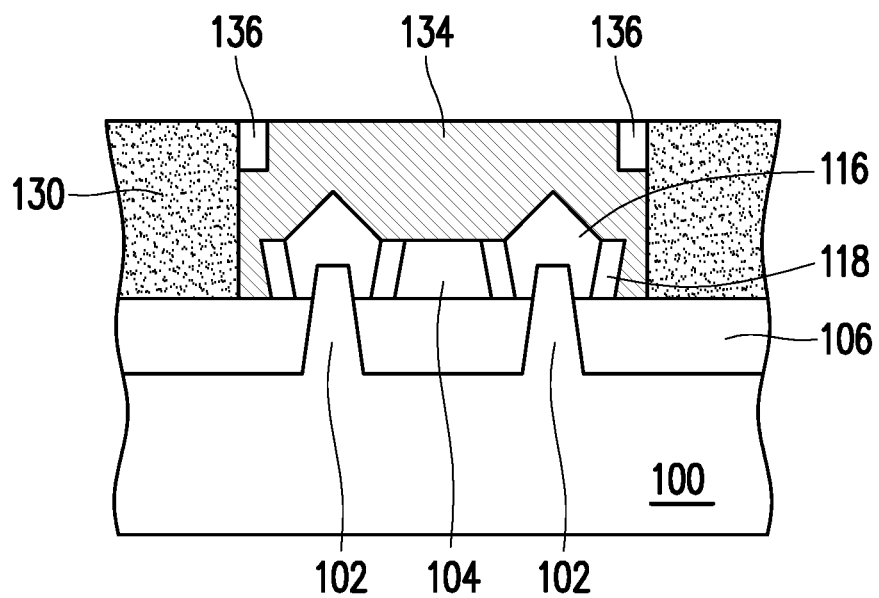

Referring to FIGS. 1G and 2F, the conductive contacts 134, the gate helmets 124a-124d and the hard masks 120, 130 are co-planarized. In some embodiments, the gate helmets 124a-124d, the hard masks 120, 130 and the spacers 136 are partially removed, and a height of the conductive contacts 134 is increased. In other words, a re-formation or re-growth process is performed on the conductive contacts 134. In detail, a conductive material (not shown) is formed on the conductive contacts 134 between the spacers 136. In some embodiments, the conductive material may be the same as or different from the material of the conductive contacts 134. Then, by using the top surface of the gate spacer 112a, 112b aside the hard mask 130 as a stop layer, portions of the conductive material, the spacers 136, the hard mask 130 and the gate helmets 124a-124d are removed, so as to planarize the top surfaces of the conductive contacts 134, the gate helmets 124a-124d and the hard masks 120, 130. After that, in some embodiments, each of the hard mask 120, the conductive contacts 134, the gate structure 110a-110d, the gate helmets 124a-124d over the gate structure 110a-110d and the hard mask 130 are fully surrounded by corresponding spacers formed from the spacer 122, the gate spacers 112-112d and the spacers 136. In addition, the immediately adjacent two of the hard mask 120, the conductive contacts 134, the gate structure 110a-110d, the gate helmets 124a-124d may share the spacer disposed therebetween. In some embodiments, a height of the formed gate helmets 124a-124d may range from 8 to 12 nm, for example. In some embodiments, a height of the formed conductive contacts 134 may range from 24 to 32 nm, for example.

In some embodiments, a height of the gate spacers 112a, 112b aside the hard mask 130 are substantially the same as that at the beginning, and it substantially determines final heights of the conductive contacts 134, the gate helmets 124a-124d and the hard masks 120, 130. Therefore, the height of the gate spacers 112a, 112b plays an important role in the manufacturing method of the semiconductor device. Accordingly, in order to prevent being removed, the material of the gate spacers 112a, 112b is chosen to have an etching selectivity with respect to the conductive contacts 134, the gate helmets 124a-124d and the hard masks 120, 130 when etched by an etchant.

Figure 1H:
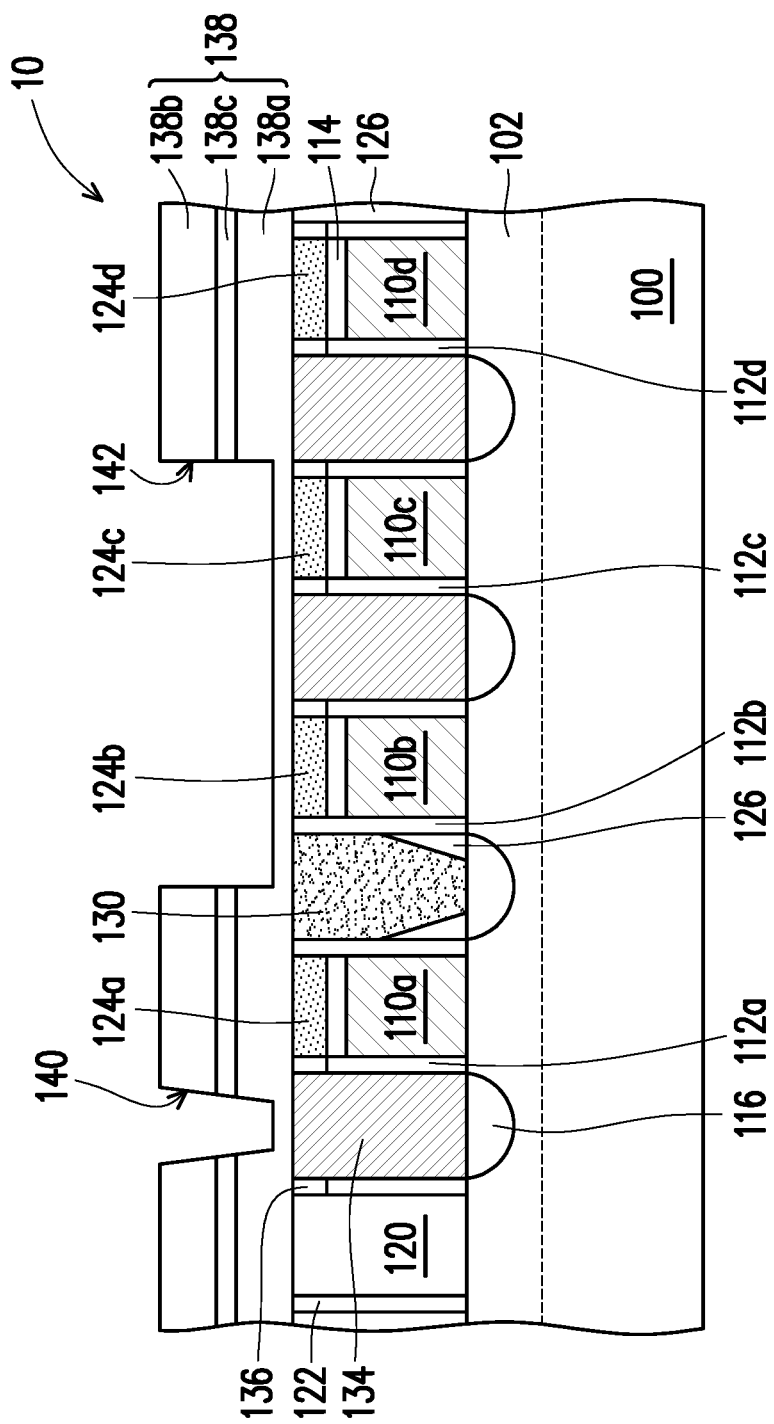
Figure 2G:
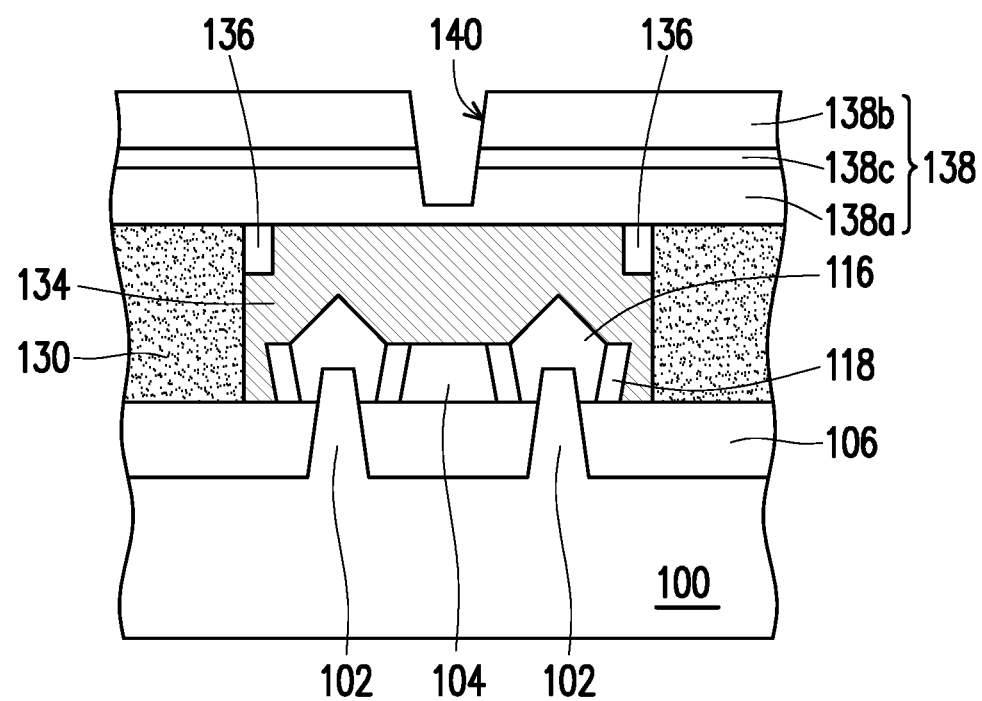

Referring to FIGS. 1H and 2G, a dielectric layer 138 is formed on the conductive contacts 134, the gate helmets 124a-124d and the hard masks 120, 130 over the dielectric layer 126. In some embodiments, the dielectric layer 138 is multi-layer structure, and may include a dielectric layer 138a, a dielectric layer 138b and a CESL layer 138c between the dielectric layers 138a, 138b, for example. A material of the dielectric layer 138a, 138b may be the same or different and may be different from a material of the CESL layer 138c. In some embodiments, the material of the dielectric layer 138a, 138b may be $SiO_2$, SiN, SiON, SiCN, or any other suitable material, and the material of the CESL layer 138c may be SiN, SiON, SiCN, or any other suitable material. In some alternative embodiments, the dielectric layer 138 may be single-layer structure or other suitable structure.

Then, a plurality of openings 140, 142 is formed in the dielectric layer 138. In some embodiments, the opening 140 is configured for a plug to be formed and electrically connected to the conductive contact 134 aside the gate structure 110a. The opening 142 is configured for a plug to be formed and electrically connected to the conductive contact 134 between the gate structures 110b, 110c and a drain potential VDR (not shown). In some embodiments, the openings 140, 142 are formed by patterning the dielectric layer 138. In detail, by using a mask (not shown), the opening 140 is formed by removing a portion of the dielectric layer 138 above the conductive contact 134 aside the gate structure 110a, and the opening 142 is formed by removing a portion of the dielectric layer 138 above the gate helmets 124b, 124c and the conductive contact 134 between the gate helmets 124b, 124c. In some embodiments, the openings 140, 142 are formed without penetrating the dielectric layer 138, and thus the openings 140, 142 do not expose the conductive contact 134 and the gate helmets 124b, 124c therebeneath.

Figure 1I:
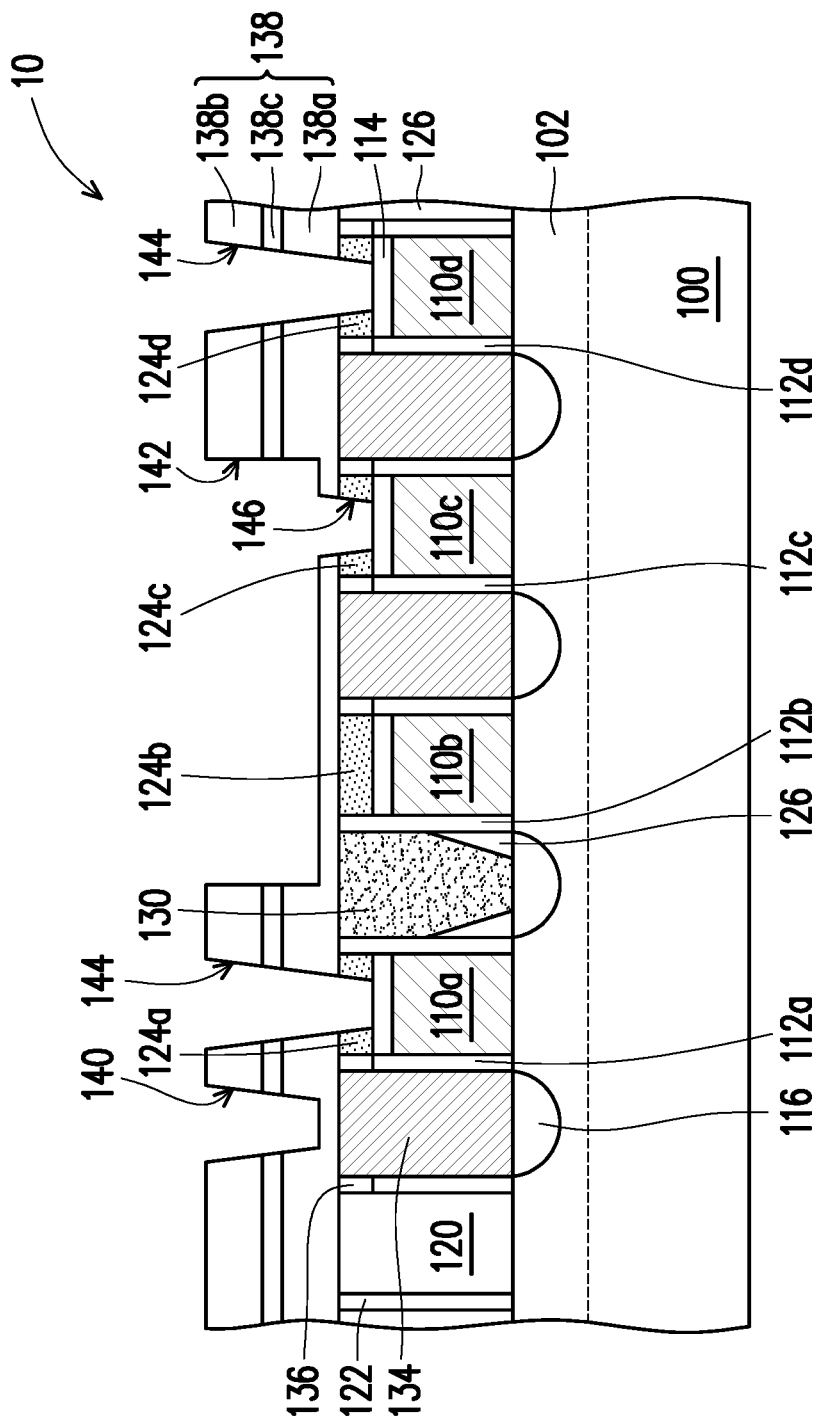

Referring to FIG. 1I, a plurality of openings 144, 146 is formed. In some embodiments, the openings 144, 146 are configured for plugs to be formed and electrically connected to the gate structures 110a, 110c, 110d respectively. In some embodiments, the openings 144, 146 is formed in and penetrates the gate helmets 124a, 124c, 124d and the dielectric layer 138 thereon. In some embodiments, the openings 144, 146 are formed by removing portions of the dielectric layer 138 and the gate helmets 124a, 124c, 124d by a removal process. In some embodiments, the removal process stops at the cap layers 114 of the gate structures 110a, 110c, 110d. In some embodiments, the cap layers 114 of the gate structures 110a, 110c, 110d are exposed by the openings 144, 146. In addition, in some embodiments, during the forming process for the openings 144, 146, the conductive contacts 134 are protected by the dielectric layer 138 thereover, and thus damage to the conductive contacts 134 is prevented.

Figure 1J:
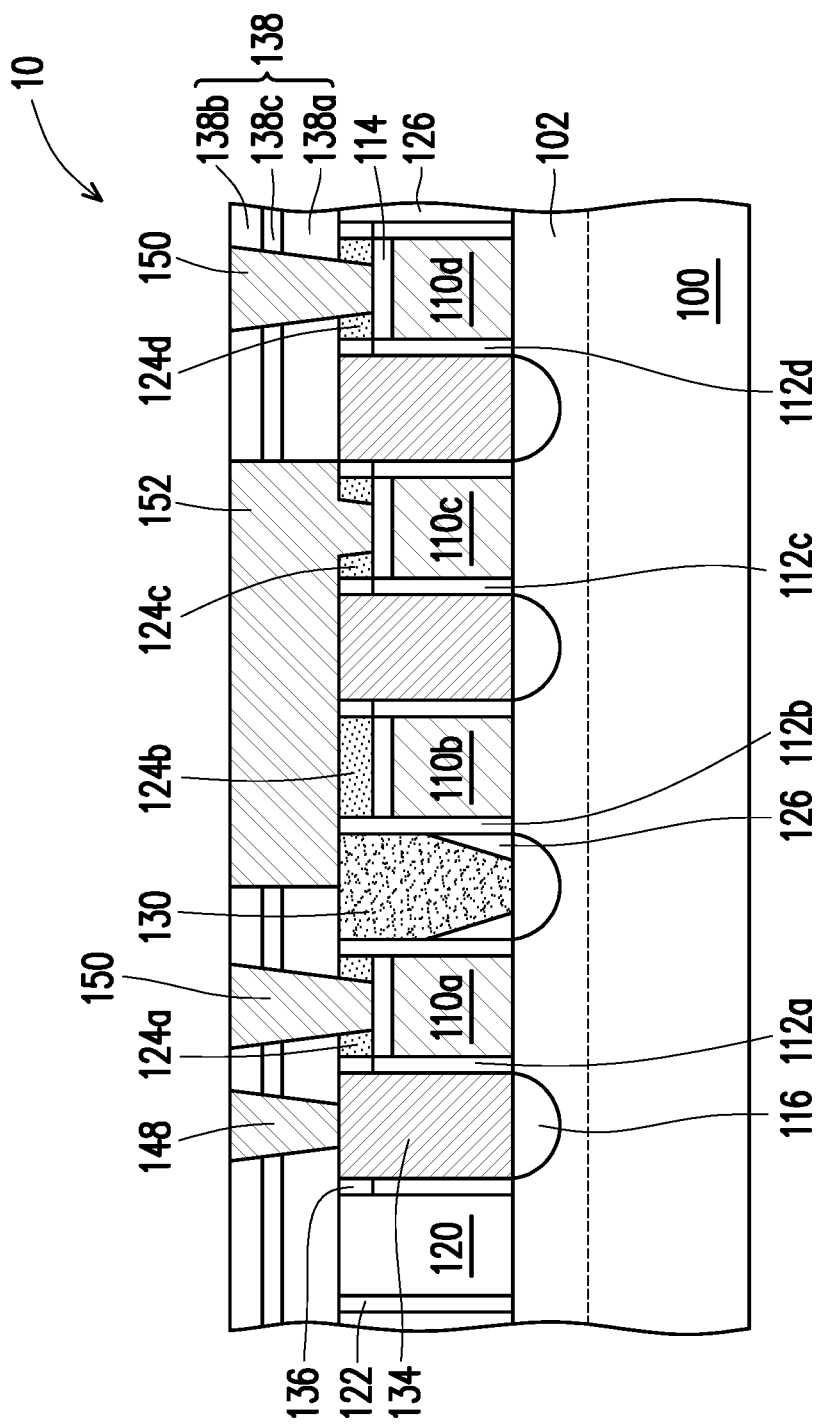
Figure 2H:
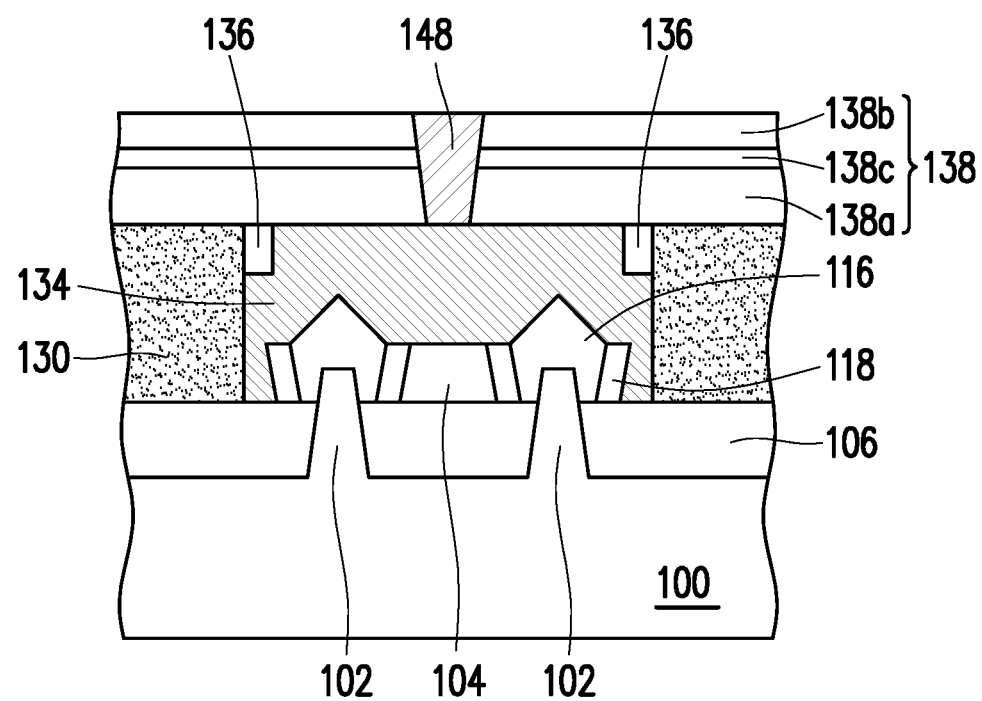

Referring to FIGS. 1J and 2H, portions of the dielectric layer 138 between the openings 140, 142 and the conductive contacts 134 are removed, so as to expose the conductive contacts 134. Then, plugs 148, 150, 152 are formed in the openings 140, 144, 142/146 respectively. In some embodiments, the plugs 148, 150, 152 are formed by forming a conductive material in the openings 140, 144, 142/146, and removing the conductive material outside the openings 140, 144, 142/146. In some embodiments, the conductive material may be formed by a deposition process and may be removed by a planarization process. In some embodiments, a portion of the dielectric layer 138b is also removed by the planarization process. After preforming the planarization process, the top surfaces of the plugs 148, 150, 152 and the dielectric layer 138 are substantially coplanar. A material of the plug 148, 150, 152 may be cobalt, tungsten, copper, titanium, tantalum, aluminum, zirconium, hafnium, the like, or other suitable metal. In some embodiments, the plug 148 is formed to electrically connect the source-drain region 116 through the conductive contact 134. The plugs 150 are formed to electrically connect the gate structures 110a, 110d. The plug 152 is formed to electrically connect the conductive contact 134 and the drain potential VDR, and in addition, the plug 150 is extended into the opening 146 to electrically connect the gate structure 110c and the drain potential VDR.

In some embodiments, the hard mask 130 is partially embedded in the dielectric layer 126 and integrally formed between the gate structures 110a, 110b and between the gate helmets 124a, 124b on the gate structures 110a, 110b. In some embodiments, in contrast to the gate helmet 124c, 124d having the spacers 136 on opposite sidewalls, the gate helmet 124a, 124b aside the hard mask 130 has only one spacer 136 on one of the opposite sidewalls. In other words, the spacer 136 is only disposed between the conductive contact 134 and the gate helmet 124a, 124b, and the gate helmet 124a, 124b is in direct contact with the hard mask 130 without any spacer therebetween. In some embodiments, the gate spacer 112a, 112c is in direct contact with the gate structure 110a, 110c and the conductive contact 134. The spacer 136 is in direct contact with the gate helmet 124a, 124c and the conductive contact 134, in other words, the spacer 136 is formed along an entire interface between the conductive contact 134 and the gate helmet 124a, 124b.

As shown in FIG. 2H, in some embodiments, the hard mask 130 is partially embedded in the dielectric layer 126 to surround the conductive contact 134 connecting to the source/drain region 116. Accordingly, the conductive contacts 134 are self-aligned isolated, and the risk of a short-circuit bridge between the adjacent conductive contacts 134 is reduced. Therefore, the critical dimension in the x and y directions of the conductive contact 134 may be enlarged and the capacitive resistance may be reduced. In addition, since the spacer 136 is disposed between the plug 148 on the conductive contact 134 and the gate structure 110a, an isolation therebetween is improved. Similarly, since the spacer 136 is disposed between the plug 150 on the gate structure 110a and the conductive contact 134 adjacent to the plug 150, and isolation therebetween is improved.

In some embodiments, by forming the hard mask between the conductive contacts, the isolation between the conductive contacts is improved. Accordingly, a vertical length (i.e., a length in the y direction) of the conductive contact may be increased, and the capacitive resistance may be reduced. In addition, since the hard mask is embedded in the dielectric layer between the conductive contacts, the space between the conductive contacts may be further shrink. Furthermore, by disposing the spacer on the sidewall of the conductive contact, the isolation between the plug on the conductive contact and the gate structure and between is improved. In addition, due the spacer disposed between the plug on the gate structure and the conductive contact, the plug and the conductive contact are self-aligned formed, and the process window of the overlay process of the plug on the gate structure and the conductive contact can be enlarged. Therefore, the risk of a short-circuit bridge between the adjacent conductive contacts is highly reduced.

In accordance with some embodiments of the disclosure, a semiconductor device includes a substrate, a first gate structure and a second gate structure over the substrate, a first hard mask on the first gate structure and a second hard mask on the second gate structure and a third hard mask. The third hard mask is disposed in a dielectric layer between the first gate structure and the second gate structure and disposed between the first hard mask and the second hard mask.

In accordance with alternative embodiments of the disclosure, a semiconductor device includes a substrate, a gate structure over the substrate, a hard mask on the gate structure, a source-drain region in the substrate aside the gate structure, a conductive contact disposed on and electrically connecting the source-drain region, a first spacer and a second spacer. The first spacer is disposed between the gate structure and the conductive contact, wherein a top surface of the first spacer is substantially flush with a top surface of the gate structure. The second spacer is disposed on the first spacer and between the hard mask and the conductive contact, wherein a top surface of the second spacer is substantially flush with top surfaces of the conductive contact and the hard mask.

In accordance with yet alternative embodiments of the disclosure, a semiconductor device includes a substrate, a gate structure over the substrate, a hard mask on the gate structure, a source-drain region in the substrate aside the gate structure, a conductive contact disposed on and electrically connecting the source-drain region, a first plug disposed on and electrically connecting the gate structure, a second plug disposed on and electrically connecting the conductive contact and a spacer disposed along an entire interface between the conductive contact and the hard mask.

In accordance with yet alternative embodiments of the disclosure, a semiconductor device includes a substrate, a first gate structure and a second gate structure over the substrate, a first hard mask on a top surface of the first gate structure, a second hard mask on the second gate structure and a third hard mask disposed between the first gate structure and the second gate structure and disposed between the first hard mask and the second hard mask. A bottom surface of the third hard mask is substantially flush with a bottom surface of the first gate structure.

In accordance with yet alternative embodiments of the disclosure, a semiconductor device includes a substrate, a gate structure over the substrate, a hard mask on the gate structure, a source-drain region in the substrate aside the gate structure, a conductive contact disposed on and electrically connecting the source-drain region, a first spacer between the gate structure and the conductive contact, and a second spacer on the first spacer and between the hard mask and the conductive contact. A top surface of the second spacer is substantially flush with a top surface of the conductive contact.

In accordance with yet alternative embodiments of the disclosure, a semiconductor device includes a first gate structure, a second gate structure, a third gate structure, a first hard mask on the first gate structure, a second hard mask on the second gate structure, a third hard mask on the third gate structure, a conductive contact between the first gate structure and the second gate structure and between the first hard mask and the second hard mask, a fourth hard mask between the second gate structure and the third gate structure and a first plug penetrating through the first hard mask to electrically connect the first gate structure and extended onto the conductive contact, the second gate structure and the fourth hard mask.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate;
   a first gate structure and a second gate structure over the substrate;
   a first hard mask on a top surface of the first gate structure;
   a second hard mask on the second gate structure; and
   a third hard mask, disposed between the first gate structure and the second gate structure and disposed between the first hard mask and the second hard mask, wherein a bottom surface of the third hard mask is substantially flush with a bottom surface of the first gate structure, wherein a lateral width of an uppermost portion of the third hard mask is greater than a lateral width of a lowermost portion of the third hard mask.

2. The semiconductor device as claimed in claim 1, wherein a top surface of the third hard mask is substantially flush with the top surface of the first hard mask.

3. The semiconductor device as claimed in claim 1 further comprising a dielectric layer between the third hard mask and a sidewall of the first gate structure and between the third hard mask and a sidewall of the second gate structure.

4. The semiconductor device as claimed in claim 3, wherein the third hard mask has tapered sidewalls which are in direct contact with the dielectric layer.

5. The semiconductor device as claimed in claim 1 further comprising a source-drain region between the first gate structure and the second gate structure, wherein the third hard mask is in direct contact with the source-drain region.

6. The semiconductor device as claimed in claim 1 further comprising first spacers on opposite sidewalls of the first gate structure, wherein top surfaces of first spacers are substantially coplanar the top surface of the first gate structure and a top surface of the third hard mask.

7. The semiconductor device as claimed in claim 6, wherein the third hard mask has substantially vertical sidewalls which are in direct contact with the first spacers.

8. A semiconductor device, comprising:
   a substrate;
   a gate structure over the substrate;
   a hard mask on the gate structure;
   a source-drain region in the substrate aside the gate structure;
   a conductive contact disposed on and electrically connecting the source-drain region;
   a first spacer between the gate structure and the conductive contact;
   a second spacer on the first spacer and between the hard mask and the conductive contact, wherein a top surface of the second spacer is substantially flush with a top surface of the conductive contact; and
   a third spacer, wherein the first spacer and the second spacer are disposed at a first side of the gate structure, the third spacer is disposed at a second side opposite to the first side of the gate structure, and a top surface of the third spacer is substantially flush with the top surface of the second spacer.

9. The semiconductor device as claimed in claim 8, wherein the second spacer is overlapped with the first spacer therebeneath.

10. The semiconductor device as claimed in claim 8, wherein a sidewall of the second spacer is aligned with a sidewall of the first spacer.

11. The semiconductor device as claimed in claim 8, wherein the first spacer is in direct contact with the gate structure and the conductive contact.

12. The semiconductor device as claimed in claim 8, wherein the second spacer is in direct contact with the hard mask and the conductive contact.

13. The semiconductor device as claimed in claim 8, wherein a bottom surface of the third spacer is substantially flush with a bottom surface of the first spacer.

14. The semiconductor device as claimed in claim 8, wherein the top surface of the third spacer is substantially flush with a top surface of the hard mask.

15. A semiconductor device, comprising:
    a first gate structure, a second gate structure and a third gate structure;
    a first hard mask on the first gate structure, a second hard mask on the second gate structure and a third hard mask on the third gate structure;
    a conductive contact between the first gate structure and the second gate structure and between the first hard mask and the second hard mask;
    a fourth hard mask between the second gate structure and the third gate structure; and
    a first plug, penetrating through the first hard mask to electrically connect the first gate structure and extended onto the conductive contact, the second gate structure and the fourth hard mask.

16. The semiconductor device as claimed in claim 15, wherein top surfaces of the first hard mask, the second hard mask, the third hard mask and the fourth hard mask are substantially coplanar.

17. The semiconductor device as claimed in claim 15, wherein the first plug is in direct contact with the first hard mask, the second hard mask and the fourth hard mask.

18. The semiconductor device as claimed in claim 15 further comprising a first spacer on a sidewall of the first gate structure, wherein a top surface of the first spacer is substantially flush with a top surface of the first hard mask.

19. The semiconductor device as claimed in claim 18, wherein the first spacer comprises a first portion and a second portion on the first portion, and an interface between the first portion and the second portion is substantially flush with an interface between the first hard mask and the first gate structure.

20. The semiconductor device as claimed in claim 15, wherein materials of the first hard mask, the second hard mask and the third hard mask are the same.

* * * * *